United States Patent
Aboueldahab

(10) Patent No.: US 11,146,167 B1
(45) Date of Patent: Oct. 12, 2021

(54) CURRENT DETECTION FOR AN ADIABATIC POWER CONVERTER

(71) Applicant: pSemi Corporation, San Diego, CA (US)

(72) Inventor: Walid Fouad Mohamed Aboueldahab, Wokingham (GB)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 16/926,103

(22) Filed: Jul. 10, 2020

(51) Int. Cl.
*H02M 1/32* (2007.01)
*G01R 19/165* (2006.01)
*H02M 3/07* (2006.01)
*H02M 1/00* (2006.01)

(52) U.S. Cl.
CPC ........ *H02M 1/32* (2013.01); *G01R 19/16571* (2013.01); *H02M 3/07* (2013.01); *H02M 1/0009* (2021.05)

(58) Field of Classification Search
CPC ....................................................... H02M 1/32
USPC ............................................................ 327/14
See application file for complete search history.

(56) References Cited

U.S. PATENT DOCUMENTS

| | | |
|---|---|---|
| 8,619,445 B1 | 12/2013 | Low et al. |
| 9,847,712 B2 | 12/2017 | Low et al. |
| 10,063,132 B1 * | 8/2018 | Huang ............... H02M 1/32 |

\* cited by examiner

*Primary Examiner* — Tomi Skibinski
(74) *Attorney, Agent, or Firm* — Jaquez Land Greenhaus & McFarland LLP; John Land, Esq.

(57) ABSTRACT

Over-current detection circuits and methods for adiabatic power converters that provide numerous advantages over known solutions, including simple digital control, enabling trimming to be done in the low voltage domain, and avoidance of high-voltage sense current mirrors. Embodiments include a slope detector circuit configured to measure a slope of the immediate output voltage $V_X$ of an adiabatic power converter during a charge pump clock cycle, compare the measured slope to a pre-determined value representing a slope of an over-current condition, and assert a flag if comparison indicates an over-current condition. An auto-calibration circuit may be included which presents a set of known loads across the output of an adiabatic power converter at device startup, measures the resulting counts from the slope detector counter, and extrapolates to a count that corresponds to a maximum allowed current.

24 Claims, 8 Drawing Sheets

CURRENT DETECTION FOR AN ADIABATIC POWER CONVERTER

BACKGROUND

(1) Technical Field

This invention relates to electronic circuits, and more particularly to power converter circuits.

(2) Background

Many electronic products, particularly mobile computing and/or communication products and components (e.g., notebook computers, ultra-book computers, tablet devices, LCD and LED displays) require multiple voltage levels. For example, radio frequency transmitter power amplifiers may require relatively high voltages (e.g., 12V or more), whereas logic circuitry may require a low voltage level (e.g., 1-2V). Still other circuitry may require an intermediate voltage level (e.g., 5-10V). In addition, direct current (DC) power is becoming more important as portable devices, solar energy, electric vehicles, and DC power distribution become widespread. A major issue with DC power has been difficulty in efficiently changing voltage levels, unlike the ease with which AC power can be converted using highly efficient transformers.

In light of these needs and applications, DC-to-DC power converters are often used to generate a lower or higher voltage from a common power source, such as a battery. Power converters which generate a lower output voltage (e.g., $V_{OUT}$) level from a higher input voltage (e.g., $V_{IN}$) power source are commonly known as step-down or buck converters, so-called because $V_{OUT}<V_{IN}$, and hence the converter is "bucking" the input voltage. Power converters which generate a higher output voltage level from a lower input voltage power source are commonly known as step-up or boost converters, because $V_{OUT}>V_{IN}$. In many embodiments, a power converter may be bi-directional, being either a step-up or a step-down converter depending on how a power source is connected to the converter. As is known in the art, an AC-DC power converter can be built up from a DC-DC power converter by, for example, first rectifying an AC input to a DC voltage and then applying the DC voltage to a DC-DC power converter.

In recent years, DC-to-DC power converters have become available with around 90% efficiency. However, efforts have been made to develop even higher efficiency DC-to-DC power converters. One such effort has been the development of high-efficiency adiabatic DC-to-DC power converters. For example, FIG. 1 is a block diagram showing a prior art adiabatic DC-to-DC power converter 100. An adiabatic DC-to-DC power converter generally means a converter design that stores charge and reuses that charge to improve efficiency. In the illustrated example, the power converter 100 includes a core block 101 that includes a converter circuit 102 and a controller 104. The converter circuit 102 is configured to receive an input voltage $V_{IN}$ from a voltage source 106 across terminals V1+, V1−, and transform the input voltage $V_{IN}$ into an output voltage $V_{OUT}$ across terminals V2+, V2−. The output voltage $V_{OUT}$ is generally coupled across an output capacitor $C_{OUT}$, across which may be connected a load 108.

The converter circuit 102 may be a charge pump that includes a switched-capacitor network configured to boost or buck $V_{IN}$ to $V_{OUT}$. As used in this disclosure, "charge pump" refers to a switched-capacitor network configured to boost or buck $V_{IN}$ to $V_{OUT}$. Examples of such charge pumps include cascade multiplier, Dickson, ladder, series-parallel, Fibonacci, and doubler switched-capacitor networks, all of which may be configured as a multi-phase or a single-phase network.

A power converter 100 based on a charge pump converter circuit 102 uses capacitors to transfer charge from the input to the output of the power converter 100. These charge transfer capacitors are commonly known as "fly capacitors" or "charge pump capacitors" and may be external components coupled to an integrated circuit (IC) embodiment of the power converter 100. (It should be noted that while this disclosure distinguishes between a power converter 100 and a charge pump converter circuit 102, much of the literature labels the entire power converter 100 as a "charge pump").

The controller 104 receives a set of input signals and produces a set of output signals. Some of these input signals arrive along a signal path 110 connected to the converter circuit 102. These input signals carry information that is indicative of the operational state of the converter circuit 102. The controller 104 also receives at least a clock signal CLK and one or more external input/output signals I/O that may be analog, digital, or a combination of both. Based upon the received input signals, the controller 104 produces a set of control signals back to the converter circuit 102 on the signal path 110 that control the internal components of the converter circuit 102 (e.g., internal switches, such as low voltage FETs, especially MOSFETs) to cause the converter circuit 102 to boost or buck $V_{IN}$ to $V_{OUT}$. In some embodiments, an auxiliary circuit (not shown) may provide various signals to the controller 104 (and optionally directly to the converter circuit 102), such as the clock signal CLK, the input/output signals I/O, as well as various voltages, such as a general supply voltage $V_{DD}$ and a transistor bias voltage $V_{BIAS}$. In the illustrated example, the controller 104 provides non-overlapping complementary clock signals P1 and P2 to the converter circuit 102 on separate lines; however, the clock signals P1, P2 could be provided over the signal path 110.

In the illustrated example, a $V_X$ node at the output of the converter circuit 102 is coupled through an adiabatic inductor L to the output capacitor $C_{OUT}$. The adiabatic inductor L improves the efficiency of the power converter 100 by storing energy during certain periods of a capacitor charging cycle and reusing that energy during other periods of the charging cycle, thus reducing charge distribution losses. At any switching phase, the charge re-distributed from the charge pump capacitors to the output capacitor $C_{OUT}$ passes through the inductor L which reduces the peak currents associated with the charge distribution. The inductor L can be quite small (in both value and size), making adiabatic charge pumps very attractive to industry.

An optional intermediate capacitor $C_{VX}$ may be coupled across the output terminals V2+, V2− of the converter circuit 102 before the adiabatic inductor L (as shown by dotted connection lines) to smooth out the voltage at the $V_X$ node. The capacitance of an intermediate capacitor $C_{VX}$ generally would be set to be much smaller than the capacitance of the output capacitor $C_{OUT}$ (e.g., 50 to 100 times smaller) and smaller than the capacitance of charge pump capacitors within the converter circuit 102 (e.g., 5 to 10 times smaller).

The immediate output of the core block 101 is the $V_X$ node. The ultimate output of the power converter 100 is at $V_{OUT}$ across terminals V2+, V2−, particularly since the inductor L and the output capacitor $C_{OUT}$ are often external components with respect to an integrated circuit implementation of the switching functionality in the core block 101.

A problem that can arise with conventional power converters 100 based on a charge pump converter circuit 102 is that high currents through the load 108 can exceed the current handling capabilities of the power converter 100. For example, in IC embodiments of a power converter 100, excessive load currents can cause the IC to overheat to the extent the IC is permanently damaged, such as (by way of example only) by exceeding the current densities of the IC routing metals. Load currents may exceed an IC design limit, for example, if a $V_{OUT}$ short circuit event occurs and/or if $V_{IN}$ falls rapidly with respect to $V_X$ or $V_{OUT}$. Such over-current events may occur, for example, during assembly of a power converter 100 with other components to make a system (e.g., a cell phone), during system test, and/or during operational use, such as when system power supplies are switched in or out of circuit.

A common practice is to provide a current detection circuit that detects the current passing through at least one of the internal switch transistors of the charge pump converter circuit 102 and suspend operation of the power converter 100 if an over-current event occurs. For example, a matched "replica" sense transistor may be used to mirror the current passing through one of the switch transistors and then convert that current to a voltage for comparison against a reference voltage to detect an over-current event. Upon detection of an over-current event, the current detection circuit outputs an over-current flag signal that may be used to disable the power converter 100.

However, this approach is not always ideal for a number of reasons. For example: high-voltage sense transistors are generally required; the ratio between the sense transistor and the switch transistor is typically very large, which leads to a large mismatch between the replica sense transistor and the switch transistor; the current is mirrored from a switch transistor which make the mirroring accuracy poor; trimming and calibration might be needed in the high-voltage domain to trim for the gain and offset errors of the sensing loop and the current mirrors; and the speed of detection limited by the loop bandwidth. All of these factors cause current detection to be slow and the detection point variation becomes very wide.

The present invention provides simple yet accurate over-current detection circuits and methods for adiabatic power converters that provide numerous advantages over known solutions.

SUMMARY

The present invention encompasses simple yet accurate over-current detection circuits and methods for adiabatic power converters that provide numerous advantages over known solutions, including simple digital control, enabling trimming to be done in the low voltage domain, and avoidance of high-voltage sense current mirrors (and thus avoidance of the associated large mismatch with respect to a switch transistor). In addition, embodiments of the present invention may include self-calibration circuitry.

For adiabatic power converters, the downward slope of $V_X$ in each charge pump (CP) clock phase is linearly related to the load current, and the greater flow of current during an overload condition draws down the voltage at the immediate output, $V_X$, more rapidly than in a non-overload condition and thus increases the voltage slope at $V_X$ with respect to the load current. Based on this realization, embodiments of the invention make use of the linear relation between the slope of $V_X$ and the load current to detect over-current events.

Embodiments include a slope detector circuit configured to measure a slope of the immediate output voltage $V_X$ during a CP Clock cycle, compare the measured slope to a pre-determined value representing a slope of an over-current condition, and assert an OverCurrent Flag as a control signal if comparison indicates an over-current condition.

The slope detector circuit may include a first comparator coupled to the immediate output voltage and to a first reference voltage and having a first output, configured to transition the state of the first output if the immediate output voltage and the first reference voltage change in a first selected relative polarity; a second comparator coupled to the immediate output voltage and to a second reference voltage and having a second output, configured to transition the state of the second output if the immediate output voltage and the second reference voltage change in a second selected relative polarity; a counter, coupled to the respective outputs of the first comparator and to the second comparator, configured to start a count when the state of the first output transitions, to stop the count when the state of the second output transitions, and to output a final count value N representing the measure of the slope of the immediate output voltage during the CP Clock cycle; and a comparator, coupled to the counter, configured to compare the final count value N to a pre-determined value $N_{OC}$ (where $N_{OC}$ represents the number of counts corresponding to an over-current slope) and output the over-current flag signal when the difference between N and $N_{OC}$ changes in a selected relative direction.

An auto-calibration circuit may be included which presents a set of known loads across the output of an adiabatic power converter at device startup, measures the resulting counts N from the slope detector counter, and extrapolates to the count $N_{OC}$ that corresponds to a maximum allowed current $I_{OC}$.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

The present invention encompasses simple yet accurate over-current detection circuits and methods for adiabatic power converters that provide simple digital control, enable trimming to be done in the low voltage domain, and avoid high-voltage sense current mirrors (and thus avoid the associated large mismatch with respect to a switch transistor). In addition, embodiments of the present invention may include self-calibration circuitry.

Figure 1:
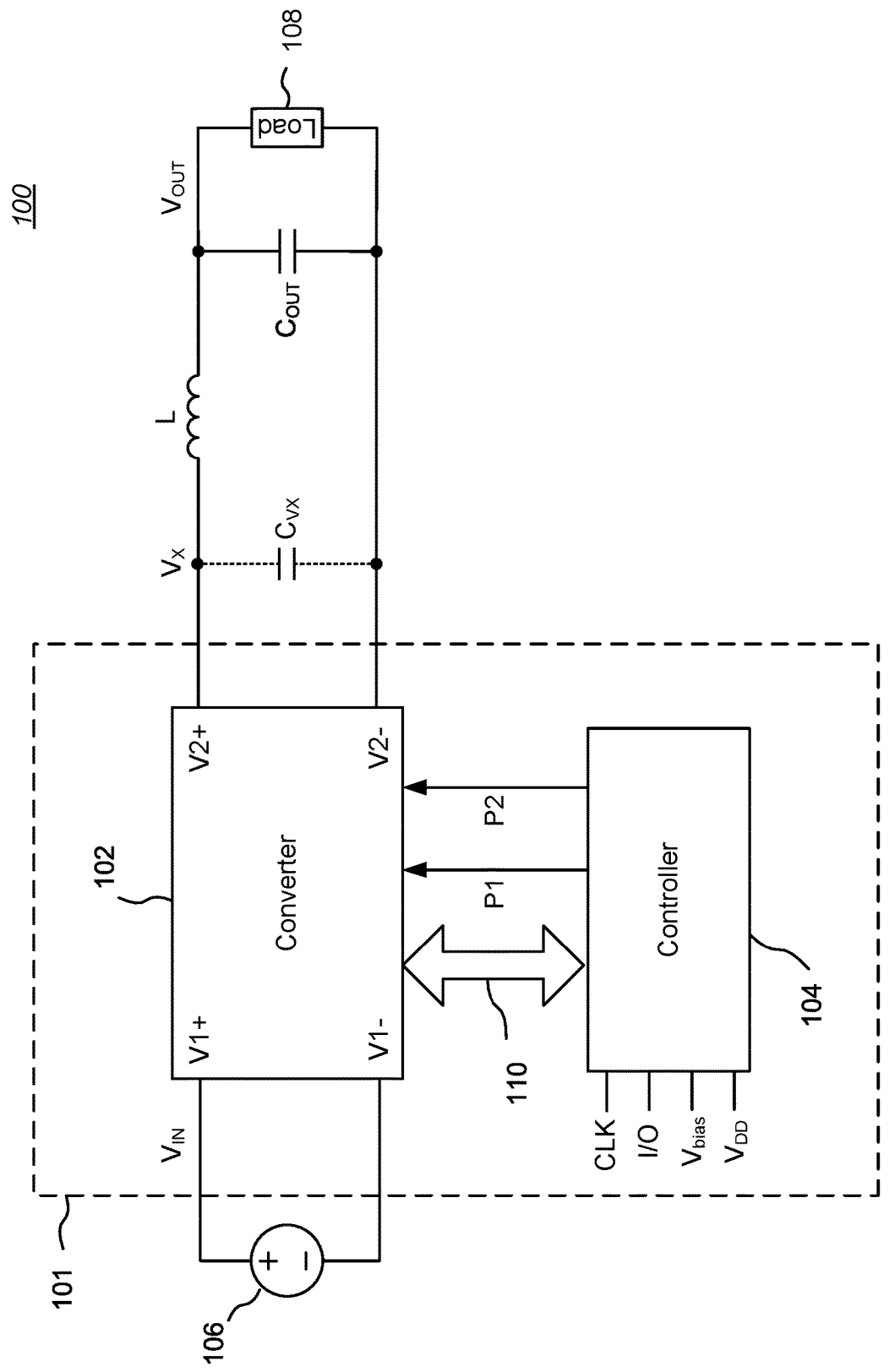
FIG. 1 is a block diagram showing a prior art adiabatic DC-to-DC power converter.
Figure 2:
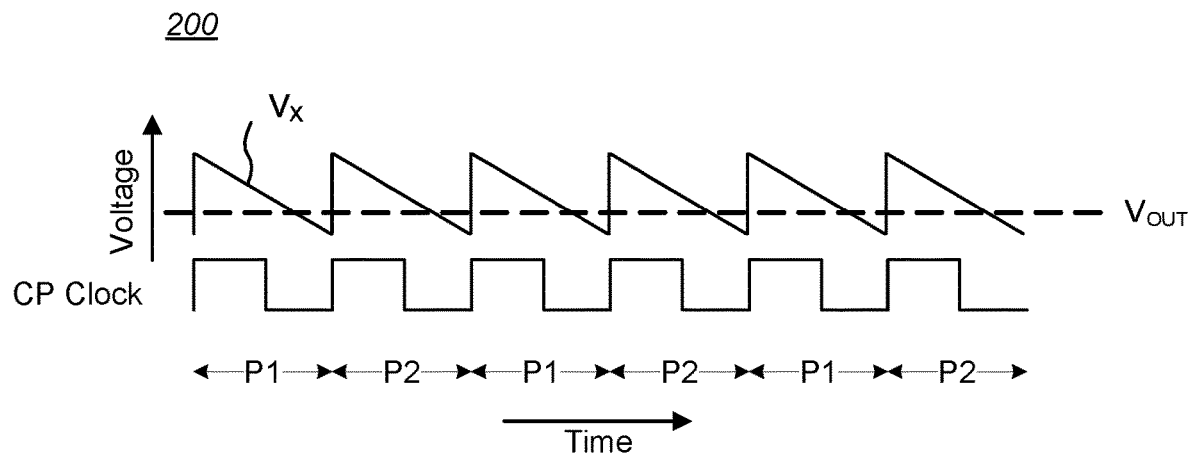
FIG. 2 is a timing diagram of the immediate output, $V_X$, of the core block of an adiabatic power converter and the ultimate output, $V_{OUT}$, of the adiabatic power converter with respect to a two-phase (P1, P2) charge pump (CP) clock in a non-overload condition.

Upon careful investigation of the characteristics of adiabatic power converters, a number of novel insights were gained. For example, FIG. 2 is a timing diagram 200 of the immediate output, $V_X$, of the core block of an adiabatic power converter and the ultimate output, $V_{OUT}$, of the adiabatic power converter with respect to a two-phase (P1, P2) charge pump (CP) clock in a non-overload condition. Due to the adiabatic effect of the inductor L (see FIG. 1), $V_X$ is a sawtooth waveform. The intermediate capacitor $C_{VX}$ smooths the sawtooth waveform to an essentially uniform DC value for $V_{OUT}$.

Figure 3:
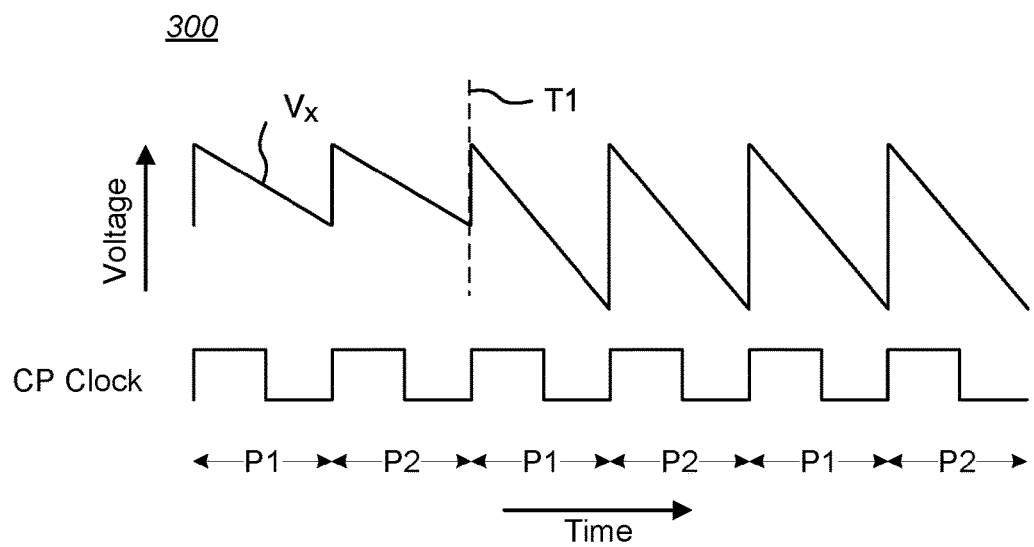
FIG. 3 is a timing diagram of the immediate output, $V_X$, of the core block of an adiabatic power converter with respect to a two-phase (P1, P2) charge pump (CP) clock in an overload condition starting at time T1.

In contrast, FIG. 3 is a timing diagram 200 of the immediate output, $V_X$, of the core block of an adiabatic power converter with respect to a two-phase (P1, P2) charge pump (CP) clock in an overload condition starting at time T1. (Omitted for the sake of clarity is a graph line for $V_{OUT}$, which generally would begin to droop at time T1). Of note, $V_X$ drops in value faster after the overload condition commences at time T1 compared to a non-overload condition.

It was realized that, for adiabatic power converters, the downward slope of $V_X$ in each CP clock phase is linearly related to the load current, and that the greater flow of current during an overload condition draws down the voltage at the immediate output, $V_X$, more rapidly than in a non-overload condition and thus increases the voltage slope at $V_X$ with respect to the load current. Based on this realization, embodiments of the invention make use of the linear relation between the slope of $V_X$ and the load current to detect over-current events.

Figure 4:
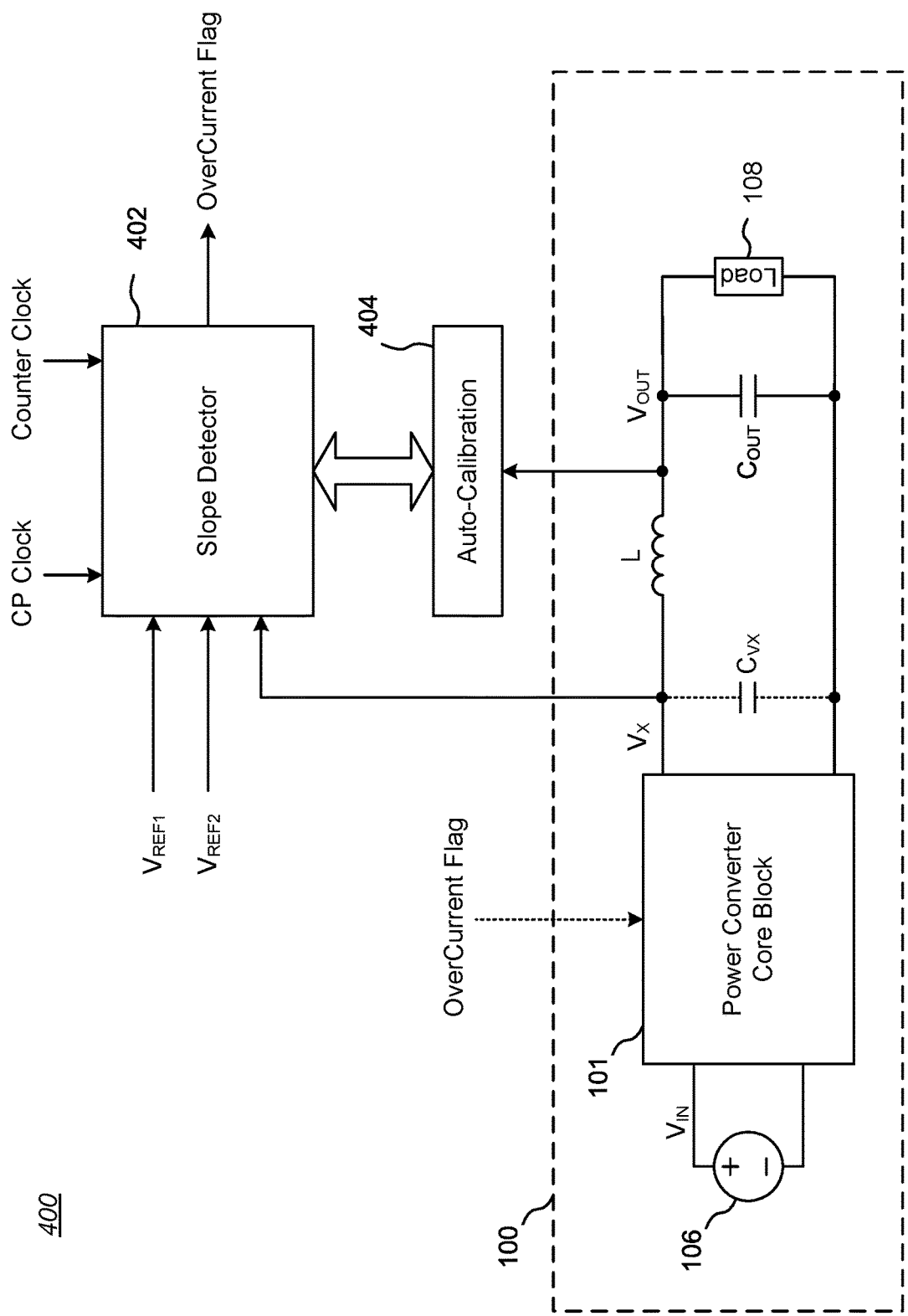
FIG. 4 is a block diagram of one embodiment of an output-based current detection configuration for an adiabatic power converter.

For example, FIG. 4 is a block diagram 400 of one embodiment of an output-based current detection configuration for an adiabatic power converter 100. A slope detector circuit 402 is coupled to the immediate output, $V_X$, of the core block 101 of the adiabatic power converter 100. Additional inputs to the slope detector circuit 402 are two reference voltages, $V_{REF1}$ and $V_{REF2}$, the CP Clock (i.e., the P1 and P2 clock signals), and a Counter Clock.

The Counter Clock can be significantly faster than the CP Clock (e.g., 5-10 times faster or more) to provide good resolution of counted events. The slope detector circuit 402 outputs at least an OverCurrent Flag which signals an over-current (overload) condition. The OverCurrent Flag may be coupled to external circuitry and/or to the controller 104 of the adiabatic power converter 100 (as indicated in FIG. 4 by the dotted line for the OverCurrent Flag) for further action, such as disabling the power converter 100. Some embodiments may include an auto-calibration circuit 404 coupled to the slope detector circuit 402 and to $V_{OUT}$ from the adiabatic power converter 100.

In general, the slope detector circuit 402 is configured to measure a slope of the immediate output voltage $V_X$ during a CP Clock cycle, compare the measured slope to a predetermined value representing a slope of an over-current condition, and assert the OverCurrent Flag as a control signal if comparison indicates an over-current condition. In some embodiments, the slope detector circuit 402 and/or the auto-calibration circuit 404 may be co-fabricated with the core block 101 of the adiabatic power converter 100 as a part of a single IC.

Figure 5:
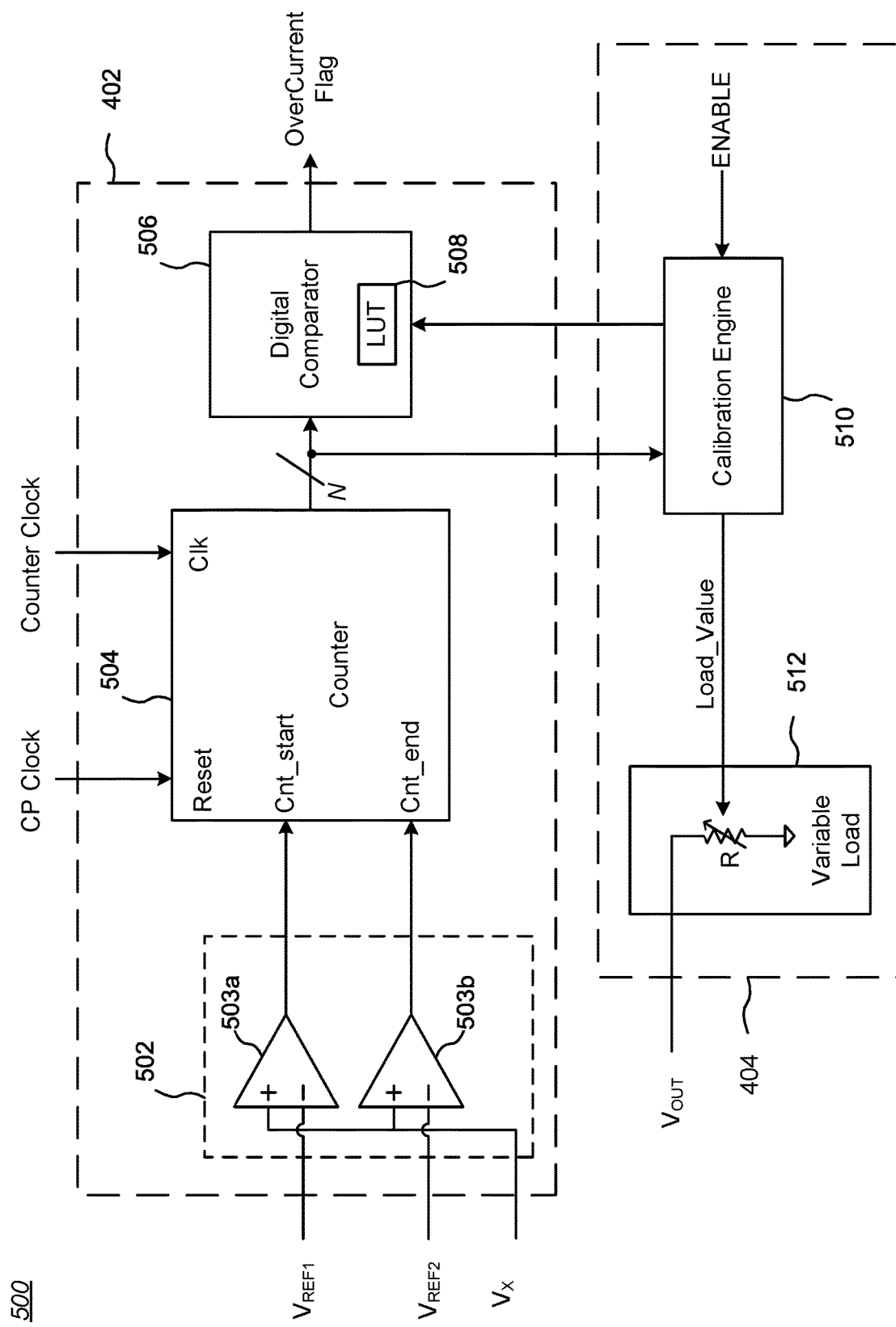
FIG. 5 is a detailed block diagram of one embodiment of a slope detector circuit and auto-calibration circuit.

FIG. 5 is a detailed block diagram 500 of one embodiment of a slope detector circuit 402 and auto-calibration circuit 404. The $V_X$ voltage is coupled to a comparator block 502 comprising two comparators 503*a*, 503*b*. In the illustrated example, the $V_X$ voltage is coupled to respective first inputs of the two comparators 503*a*, 503*b*. In other embodiments, a scaled version of the $V_X$ voltage (e.g., from a resistive voltage divider having $V_X$ as an input) may be coupled to the respective first inputs of the two comparators 503*a*, 503*b*.

The second inputs of the two comparators 503*a*, 503*b* are respectively coupled to a first reference voltage $V_{REF1}$ and a second reference voltage $V_{REF2}$. The first comparator 503*a* triggers a change in output when its respective inputs change in a selected relative polarity. Similarly, the second comparator 503*b* triggers a change in output when its respective inputs change in a selected relative polarity. For example, while $V_X$ is greater than $V_{REF1}$ or $V_{REF2}$, the comparators 503*a*, 503*b* may output a binary "1", and as $V_X$ becomes less than $V_{REF1}$ or $V_{REF2}$, the respective comparators 503*a*, 503*b* may output a binary "0". Of course, alternative embodiments can reverse the polarity of the comparisons using known means.

In some embodiments, the values of $V_{REF1}$ and $V_{REF2}$ may simply be scaled versions of the input voltage $V_{IN}$ (e.g., from a resistive voltage divider having $V_{IN}$ as an input), and thus can be trimmed in the low voltage domain. In some embodiments, the values of $V_{REF1}$ and $V_{REF2}$ may be more accurately defined by generating them as scaled versions of the output voltage $V_{OUT}$.

The output of the first comparator 503*a* is coupled to a Cnt-start input of a high-speed digital counter 504, and the output of the second comparator 503*b* is coupled to a Cnt_end input of the digital counter 504. A transition of the output of the first comparator 503*a* will start a count within digital counter 504. Conversely, a transition of the output of the second comparator 503*b* will end the count within digital counter 504. The output of the digital counter 504 is a number N that is coupled to a digital comparator 506 that functions as a count detection circuit and which may include a look-up table (LUT) 508. The number N is compared within the digital comparator 506 to at least one pre-determined number $N_{OC}$ (e.g., from the LUT 508) that represents the slope of an over-current condition. If $N \leq N_{OC}$, then an over-current condition exists and the OverCurrent Flag is asserted. Of course, alternative embodiments can reverse the polarity of the comparison using known means. Accordingly, more generally, the digital comparator 506 asserts the OverCurrent Flag when the difference between N and $N_{OC}$ changes in polarity and/or by a desired amount.

Although the example embodiment illustrated in FIG. 5 has two comparators 503*a*, 503*b*, two related $V_{REFx}$ inputs, and a single output from the counter 504, the example can be extended to n+1 comparators, n+1 $V_{REF}$ inputs, and n different counter outputs.

Figure 6:
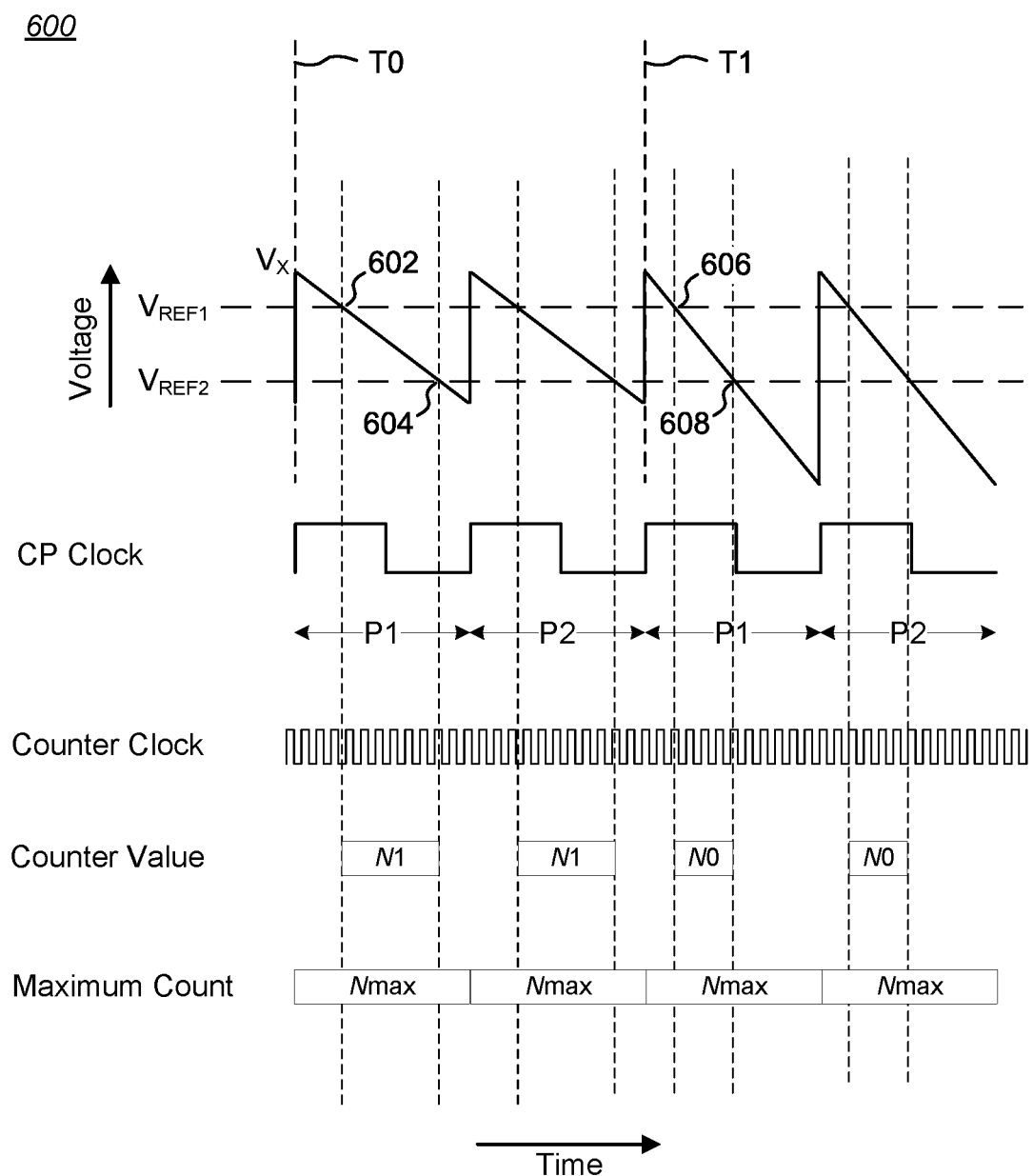
FIG. 6 is a timing diagram showing the relative timing of the immediate output, $V_X$, of the core block of an adiabatic power converter, the CP Clock, and the Counter Clock, with resulting count values from the digital counter, under varying load conditions.

FIG. 6 is a timing diagram 600 showing the relative timing of the immediate output, $V_X$, of the core block of an adiabatic power converter, the CP Clock, and the Counter Clock, with resulting count values from the digital counter 504, under varying load conditions. As noted above, the slope of the $V_X$ voltage is detected by comparing the value of $V_X$ against each of the two reference voltages $V_{REF1}$ and $V_{REF2}$.

In the illustrated example, during the CP clock cycle starting at time T0 (i.e., a P1 cycle during a non-overload condition), $V_X$ declines from a peak voltage above $V_{REF1}$ until it is equal to $V_{REF1}$ at intersection 602, at which time the first comparator 503a causes the digital counter 504 to start counting. Thereafter, $V_X$ continues to decline until it is equal to $V_{REF2}$ at intersection 604, at which time the second comparator 503a causes the digital counter 504 to stop counting. The output of the digital counter 504 is a number (N1 in this example) that represents the slope of $V_X$ between intersection 602 and intersection 604. So long as N1 is greater than or equal to the pre-determined number $N_{OC}$, then the load on the adiabatic power converter has not caused an over-current condition and the OverCurrent Flag is not asserted. Depending on the relative values of $V_{REF1}$ and $V_{REF2}$, the value of N1 can be as much as Nmax (which is effectively a count value representing the duration of a CP Clock cycle and may be, for example, a programmed value stored in the controller 104). In the illustrated example, the next CP clock cycle also results in a count of N1, indicating that the load on the adiabatic power converter has not changed and has not caused an over-current condition.

During a subsequent CP clock cycle starting at time T1 (i.e., a P1 cycle during an overload condition), $V_X$ declines from a peak voltage above $V_{REF1}$ until it is equal to $V_{REF1}$ at intersection 606, at which time the first comparator 503a causes the digital counter 504 to start counting. Thereafter, $V_X$ continues to decline (more rapidly than during a non-overload condition) until it is equal to $V_{REF2}$ at intersection 608, at which time the second comparator 503a causes the digital counter 504 to stop counting. The output of the digital counter 504 is a number (N0 in this example) that represents the steeper slope of $V_X$ between intersection 606 and intersection 608. If N0 is less than the pre-determined number $N_{OC}$, then the load on the adiabatic power converter has caused an over-current condition and the OverCurrent Flag is asserted. Assertion of the OverCurrent Flag may be used, for example, to disable the power converter 100. In the illustrated example, the next CP clock cycle also results in a count of N0, indicating that the overload condition on the adiabatic power converter has not changed.

Referring back to FIG. 5, the Counter 504 is reset by the CP Clock (e.g., by the rising edge of the CP Clock) so that a new count N is generated for every CP Clock cycle.

The higher frequency of the Counter Clock with respect to the CP Clock determines the count resolution. The higher the Counter Clock frequency, the better the resolution for overcurrent detection and the better accuracy of the number of counts detected between the two reference voltages. As should be clear from FIG. 5, the slope detector circuit 402 may be entirely implemented in the low voltage domain, thus avoiding the necessity of high-voltage transistors. In one example, the low voltage domain may be the same as the supply voltage of the controller in core block 101, which can be created by an internal regulator.

While the above example describes comparing the count number N to a single value $N_{OC}$ within the Digital Comparator 506, in some embodiments, the count number N may be compared to one or more values other than $N_{OC}$. The additional values, which may be stored in the LUT 508, may cause the assertion of additional flags and/or control signals when the difference between N and the additional value or values changes in polarity and/or by a desired amount. For example, an additional value greater than $N_{OC}$ may indicate that the load across an adiabatic power converter 100 is nearing (e.g., within 80%)—but not yet reached—an overload condition.

Benefits of the invention include simple digital control, trimming in the low voltage domain, and avoidance of high-voltage sense current mirrors (and thus avoidance of the associated large mismatch with respect to a switch transistor). Embodiments of the present invention may be used to protect many types of adiabatic power converters, including buck and/or boost adiabatic power converters, from over-current conditions. As a person of ordinary skill in the art will understand, a system architecture is beneficially impacted by the current invention in critical ways, including greater reliability and durability.

Auto-Calibration

The value of the pre-determined number $N_{OC}$ against which the slope number N is compared may be determined in a number of ways, including during IC testing. However, it is preferable to determine $N_{OC}$ when an IC embodiment of an adiabatic power converter 100 is in actual operation, embedded within a final product (e.g., a cellular phone).

Referring back to FIGS. 4 and 5, an auto-calibration circuit 404 may be included which presents a set of known loads across the output of an adiabatic power converter 100 at device startup, measures the resulting counts N from the counter 504, and extrapolates to the count $N_{OC}$ that corresponds to a maximum allowed current $I_{OC}$ (for example, as specified by the device manufacturer).

As shown by way of example in FIG. 5, a calibration engine 510 may be enabled by an ENABLE signal during a calibration phase of system startup. The ENABLE signal may be supplied from external circuitry and/or from the controller 104 of the adiabatic power converter 100. The calibration engine 510 may be, for example, a state machine or digital processing circuitry within the controller 104 or external to the adiabatic power converter 100.

The enabled calibration engine 510 outputs a control signal, Load_Value, to an internal variable load 512 that can draw a range of currents from $V_{OUT}$ to circuit ground. The variable load 512 may be, for example, a variable resistor R or a variable current sink. The Load_Value can be designed to cause a known safe amount of current (i.e., less than an over-current amount) to flow from $V_{OUT}$ through the variable load 512. The counter 504 operates as described previously above, generating a count N corresponding to each load imposed by the Load_Value. The generated counts N generally would be coupled to the calibration engine 510.

Figure 7:
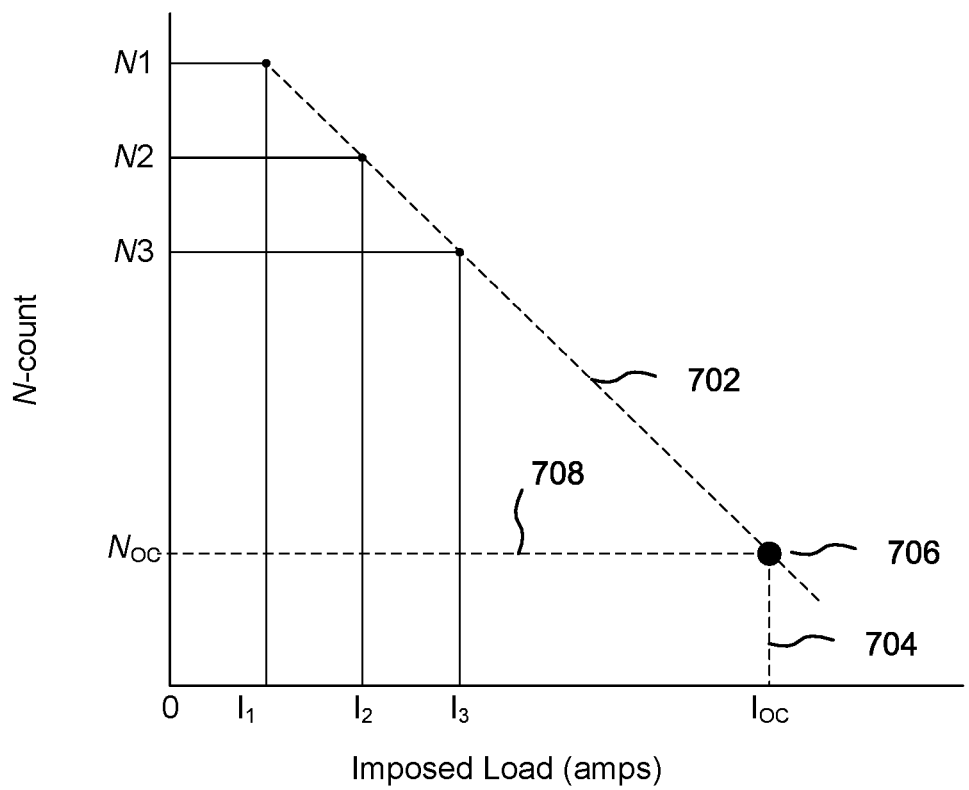
FIG. 7 is a graph showing plots of a set of N counts versus imposed load in one example embodiment of the present invention.

By presenting a number of different Load_Values to the variable load 512, a number of different N counts will be generated, which may be stored in the calibration engine 510. FIG. 7 is a graph 700 showing plots of a set of N counts versus imposed load in one example embodiment of the present invention. In the illustrated example, the load counts N1, N2, and N3 correspond to imposed (and safe) current loads of $I_1$, $I_2$, and $I_3$. Taking advantage of the linear relationship between load and $V_X$ slope (represented by the N counts), conventional curve fitting methods can be performed in the calibration engine 510 (or in other digital processing circuitry within the controller 104 or external to the adiabatic power converter 100) to extrapolate where the graph line 702 would intersect a maximum allowed current $I_{OC}$ (graph line 704) at node 706. The coordinates of the node 706 will determine the value of $N_{OC}$ (graph line 708), corresponding to an over-current threshold condition, which can then be loaded (for example) into the LUT 508 for comparison to operational count values N within the digital comparator 506.

One advantage of this auto-calibration technique is that it includes influences from the actual working environment of an embedded adiabatic power converter 100 into the determined value for $N_{OC}$, including the characteristic of the charge pump, $C_{VX}$, and $C_{OUT}$ capacitors (which are general external to an IC embodiment of the adiabatic power converter 100), the applied input voltage $V_{IN}$, the adiabatic inductor L (again, generally external to an IC embodiment of the adiabatic power converter 100), cooling structures, packaging, etc.

Methods

Figure 8:
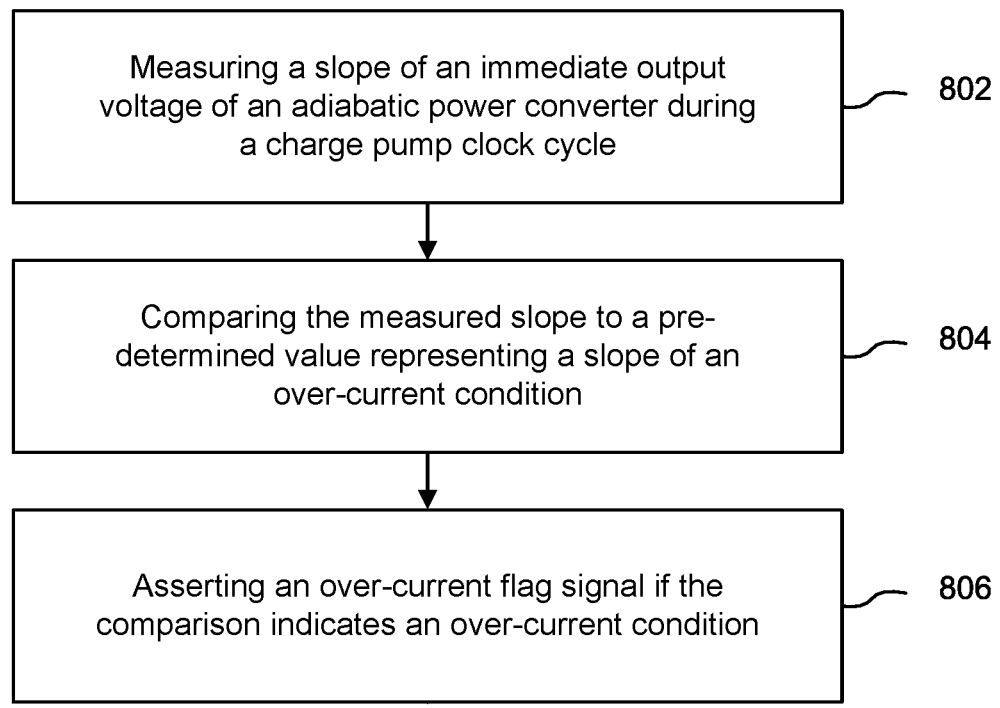
FIG. 8 is a process flow chart showing a first method for current detection in an adiabatic power converter.

Another aspect of the invention includes methods for protecting a power converter from in-rush current. For example, FIG. 8 is a process flow chart showing a first method for current detection in an adiabatic power converter. The method includes: measuring a slope of an immediate output voltage of an adiabatic power converter during a charge pump clock cycle (Block 802); comparing the measured slope to a pre-determined value representing a slope of an over-current condition (Block 804); and asserting an over-current flag signal if the comparison indicates an over-current condition (Block 806).

Figure 9:
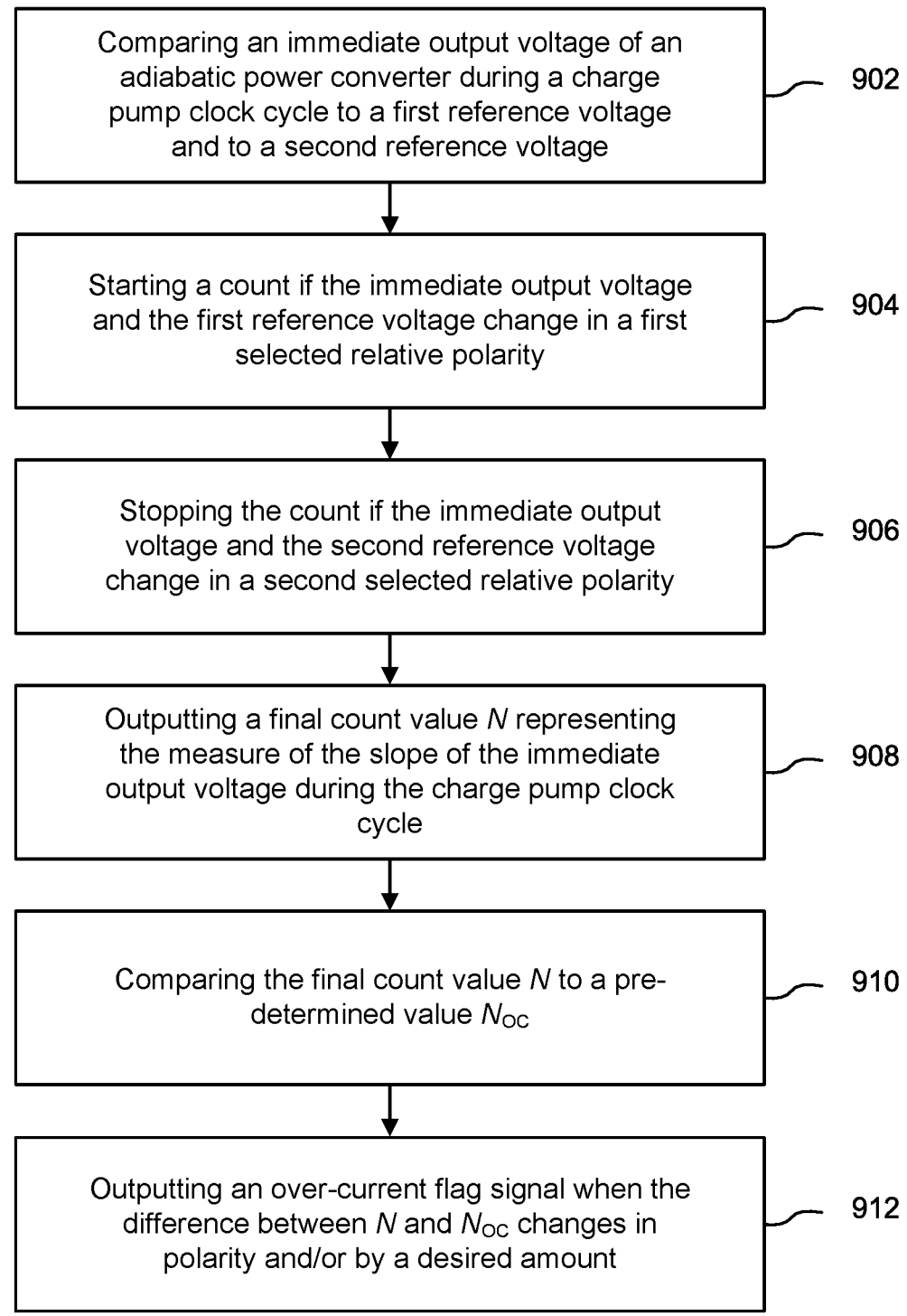
FIG. 9 is a process flow chart showing a second method for current detection in an adiabatic power converter.

FIG. 9 is a process flow chart showing a second method for current detection in an adiabatic power converter. The method includes: comparing an immediate output voltage of an adiabatic power converter during a charge pump clock cycle to a first reference voltage and to a second reference voltage (Block 902); starting a count if the immediate output voltage and the first reference voltage change in a first selected relative polarity (Block 904); stopping the count if the immediate output voltage and the second reference voltage change in a second selected relative polarity (Block 906); outputting a final count value N representing the measure of the slope of the immediate output voltage during the charge pump clock cycle (Block 908); comparing the final count value N to a pre-determined value $N_{OC}$ (Block 910); and outputting an over-current flag signal when the difference between N and $N_{OC}$ changes in polarity and/or by a desired amount (Block 912).

An additional aspect of the above methods may include presenting a set of known loads across an ultimate output of the adiabatic power converter, receiving set of final count values N each corresponding to one of the set of known loads, and extrapolating from the set of final count values N to the pre-determined value $N_{OC}$.

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form an end product such as a cellular telephone, laptop computer, or electronic tablet, or to form a higher level module which may be used in a wide variety of products, such as vehicles, test equipment, medical devices, etc. Through various configurations of modules and assemblies, such ICs typically enable a mode of communication, often wireless communication.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A current detection circuit configured to be coupled to an adiabatic power converter, including a slope detector circuit configured to be coupled to an immediate output voltage of the adiabatic power converter, and configured to measure a slope of the immediate output voltage during a charge pump clock cycle, compare the measured slope to a pre-determined value representing a slope of an over-current condition, and assert an over-current flag signal if the comparison indicates an over-current condition.

2. The invention of claim 1, wherein the slope detector circuit includes:
   (a) a comparison circuit coupled to the immediate output voltage, to a first reference voltage, and to a second reference voltage, configured to transition the state of a first output if the immediate output voltage and the first reference voltage change in a first selected relative polarity, and to transition the state of a second output if the immediate output voltage and the second reference voltage change in a second selected relative polarity;
   (b) a counter, coupled to the respective outputs of the comparison circuit, the counter configured to start a count when the state of the first output transitions, to stop the count when the state of the second output transitions, and to output a final count value N representing the measure of the slope of the immediate output voltage during the charge pump clock cycle; and
   (c) a count detection circuit, coupled to the counter, configured to compare the final count value N to a pre-determined value $N_{OC}$ and output the over-current flag signal if the difference between N and $N_{OC}$ changes in polarity and/or by a desired amount.

3. The invention of claim 2, wherein the pre-determined value $N_{OC}$ corresponds to a maximum current of the adiabatic power converter.

4. The invention of claim 2, wherein the counter is coupled to a counter clock having a frequency greater than the frequency of the charge pump clock cycle.

5. The invention of claim 2, wherein the count detection circuit is further configured to compare the final count value N to at least one other pre-determined value and output a signal indicative of the comparison if the difference between N and the at least one other predetermined value changes in polarity and/or by a desired amount.

6. The invention of claim 2, further including an auto-calibration circuit, coupled to an ultimate output of the adiabatic power converter and to the slope detector circuit, the auto-calibration configured to present a set of known loads across the ultimate output of the adiabatic power converter, to receive from the counter a set of final count values N each corresponding to one of the set of known loads, and to extrapolate from the set of final count values N to the pre-determined value $N_{OC}$.

7. The invention of claim 1, wherein the slope detector circuit includes:
   (a) a first comparator coupled to the immediate output voltage and to a first reference voltage and having a first output, the first comparator configured to transition the state of the first output if the immediate output voltage and the first reference voltage change in a first selected relative polarity;
   (b) a second comparator coupled to the immediate output voltage and to a second reference voltage and having a second output, the second comparator configured to transition the state of the second output if the immediate output voltage and the second reference voltage change in a second selected relative polarity;
   (c) a counter, coupled to the respective outputs of the first comparator and to the second comparator, the counter configured to start a count when the state of the first output transitions, to stop the count when the state of the second output transitions, and to output a final count value N representing the measure of the slope of the immediate output voltage during the charge pump clock cycle; and
   (d) a count detection circuit, coupled to the counter, configured to compare the final count value N to a pre-determined value $N_{OC}$ and output the over-current flag signal if the difference between N and $N_{OC}$ changes in polarity and/or by a desired amount.

8. The invention of claim 7, wherein the pre-determined value $N_{OC}$ corresponds to a maximum current allowed through the adiabatic power converter.

9. The invention of claim 7, wherein the count detection circuit is further configured to compare the final count value N to at least one other pre-determined value and output a signal indicative of the comparison if the difference between N and the at least one other predetermined value changes in polarity and/or by a desired amount.

10. The invention of claim 7, further including an auto-calibration circuit, coupled to an ultimate output of the adiabatic power converter and to the slope detector circuit, the autocalibration circuit configured to present a set of known loads across the ultimate output of the adiabatic power converter, to receive from the counter a set of final count values N each corresponding to one of the set of known loads, and to extrapolate from the set of final count values N to the pre-determined value $N_{OC}$.

11. An adiabatic power converter including:
    (a) a converter circuit configured to convert an input voltage to an immediate output voltage;
    (b) an output capacitor;
    (c) an inductor coupled between the converter circuit and the output capacitor; and
    (d) a slope detector circuit coupled to the converter circuit, and configured to measure a slope of the immediate output voltage during a charge pump clock cycle, compare the measured slope to a pre-determined value representing a slope of an over-current condition, and assert an over-current flag signal if comparison indicates an over-current condition through the converter circuit.

12. The invention of claim 11, wherein the slope detector circuit includes:
    (a) a comparison block circuit coupled to the immediate output voltage, to a first reference voltage, and to a second reference voltage, configured to transition the state of a first output if the immediate output voltage and the first reference voltage change in a first selected relative polarity, and to transition the state of a second output if the immediate output voltage and the second reference voltage change in a second selected relative polarity;
- (b) a counter, coupled to the respective outputs of the comparison circuit block, configured to start a count when the state of the first output transitions, to stop the count when the state of the second output transitions, and to output a final count value N representing the measure of the slope of the immediate output voltage during the charge pump clock cycle; and
- (c) a count detection circuit, coupled to the counter, configured to compare the final count value N to a pre-determined value $N_{OC}$ and output the over-current flag signal if the difference between N and $N_{OC}$ changes in polarity and/or by a desired amount.

13. The invention of claim 12, wherein the pre-determined value $N_{OC}$ corresponds to a maximum current allowed through the adiabatic power converter.

14. The invention of claim 12, wherein the count detection circuit is further configured to compare the final count value N to at least one other pre-determined value and output a signal indicative of the comparison if the difference between N and the at least one other predetermined value changes in polarity and/or by a desired amount.

15. The invention of claim 12, further including an auto-calibration circuit, the autocalibration circuit coupled to an ultimate output of the adiabatic power converter and to the slope detector circuit, the auto-calibration circuit further configured to present a set of known loads across the ultimate output of the adiabatic power converter, to receive from the counter a set of final count values N each corresponding to one of the set of known loads, and to extrapolate from the set of final count values N to the pre-determined value $N_{OC}$.

16. The invention of claim 15, wherein the auto-calibration circuit is co-fabricated with the converter circuit of the adiabatic power converter as a part of a single integrated circuit.

17. The invention of claim 11, wherein the slope detector circuit includes:
- (a) a first comparator coupled to the immediate output voltage and to a first reference voltage and having a first output, configured to transition the state of the first output if the immediate output voltage and the first reference voltage change in a first selected relative polarity;
- (b) a second comparator coupled to the immediate output voltage and to a second reference voltage and having a second output, configured to transition the state of the second output if the immediate output voltage and the second reference voltage change in a second selected relative polarity;
- (c) a counter, coupled to the respective outputs of the first comparator and to the second comparator, configured to start a count when the state of the first output transitions, to stop the count when the state of the second output transitions, and to output a final count value N representing the measure of the slope of the immediate output voltage during the charge pump clock cycle; and
- (d) a count detection circuit, coupled to the counter, configured to compare the final count value N to a pre-determined value $N_{OC}$ and output the over-current flag signal if the difference between N and $N_{OC}$ changes in polarity and/or by a desired amount.

18. The invention of claim 17, wherein the pre-determined value $N_{OC}$ corresponds to a maximum current of the adiabatic power converter.

19. The invention of claim 17, wherein the count detection circuit is further configured to compare the final count value N to at least one other pre-determined value and output a signal indicative of the comparison if the difference between N and the at least one other predetermined value changes in polarity and/or by a desired amount.

20. The invention of claim 17, further including an auto-calibration circuit, the autocalibration circuit coupled to an ultimate output of the adiabatic power converter and to the slope detector circuit, the auto-calibration circuit further configured to present a set of known loads across the ultimate output of the adiabatic power converter, to receive from the counter a set of final count values N each corresponding to one of the set of known loads, and to extrapolate from the set of final count values N to the pre-determined value $N_{OC}$.

21. The invention of claim 11, wherein the slope detector circuit is co-fabricated with the converter circuit of the adiabatic power converter as a part of a single integrated circuit.

22. A method for current detection in an adiabatic power converter, including:
- (a) measuring a slope of an immediate output voltage of the adiabatic power converter during a charge pump clock cycle;
- (b) comparing the measured slope to a pre-determined value representing a slope of an overcurrent condition; and
- (c) asserting an over-current flag signal if the comparison indicates an over-current condition.

23. A method for current detection in an adiabatic power converter, including:
- (a) comparing an immediate output voltage of the adiabatic power converter during a charge pump clock cycle to a first reference voltage and to a second reference voltage;
- (b) starting a count if the immediate output voltage and the first reference voltage change in a first selected relative polarity;
- (c) stopping the count if the immediate output voltage and the second reference voltage change in a second selected relative polarity;
- (d) outputting a final count value N representing the measure of the slope of the immediate output voltage during the charge pump clock cycle;
- (e) comparing the final count value N to a pre-determined value $N_{OC}$; and
- (f) outputting an over-current flag signal if the difference between N and $N_{OC}$ changes in polarity and/or by a desired amount.

24. The method of claim 23, further including:
- (a) presenting a set of known loads across an ultimate output of the adiabatic power converter;
- (b) receiving set of final count values N each corresponding to one of the set of known loads; and
- (c) extrapolating from the set of final count values N to the pre-determined value $N_{OC}$.

* * * * *